US011482576B2

(12) United States Patent
Kim

(10) Patent No.: US 11,482,576 B2
(45) Date of Patent: Oct. 25, 2022

(54) DISPLAY DEVICE

(71) Applicant: Samsung Display Co., Ltd., Yongin-si (KR)

(72) Inventor: Duk Sung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/153,145

(22) Filed: Jan. 20, 2021

(65) Prior Publication Data

US 2022/0020821 A1 Jan. 20, 2022

(30) Foreign Application Priority Data

Jul. 17, 2020 (KR) .................. 10-2020-0089068

(51) Int. Cl.
*H01L 27/32* (2006.01)
*H01L 51/52* (2006.01)
*G06F 3/044* (2006.01)
*G06F 3/041* (2006.01)

(52) U.S. Cl.
CPC .......... *H01L 27/322* (2013.01); *G06F 3/0412* (2013.01); *G06F 3/0443* (2019.05); *G06F 3/0446* (2019.05); *H01L 27/323* (2013.01); *H01L 27/3244* (2013.01); *H01L 51/5268* (2013.01); *H01L 51/5284* (2013.01); *G06F 2203/04111* (2013.01); *G06F 2203/04112* (2013.01)

(58) Field of Classification Search
CPC ............ C12Q 1/6886; C12Q 2600/154; H01L 27/322; H01L 27/323; H01L 27/3244; H01L 51/5268; H01L 51/3284; H01L 51/5284; G06F 3/0446; G06F 3/0443; G06F 3/0412; G06F 2203/04111; G06F 2203/04112
USPC ...................................... 345/80–88, 170–178
See application file for complete search history.

(56) References Cited

U.S. PATENT DOCUMENTS

| | | | |
|---|---|---|---|
| 9,041,869 B2 | 5/2015 | Kim et al. | |
| 10,054,819 B2 * | 8/2018 | Miki | G02F 1/133617 |
| 10,901,567 B2 * | 1/2021 | Lee | G06F 3/0443 |
| 2004/0041965 A1 * | 3/2004 | Liu | G02F 1/133526 |
| | | | 349/113 |
| 2004/0169461 A1 * | 9/2004 | Moriyama | H01L 51/5016 |
| | | | 313/503 |
| 2009/0115713 A1 * | 5/2009 | Kakinuma | G09G 3/3611 |
| | | | 345/88 |
| 2014/0204319 A1 * | 7/2014 | Cai | G02F 1/133514 |
| | | | 349/106 |
| 2016/0223870 A1 * | 8/2016 | Miki | G02F 1/133524 |
| 2019/0004638 A1 * | 1/2019 | Lee | G06F 3/0443 |
| 2021/0020725 A1 * | 1/2021 | Park | H01L 51/5209 |

(Continued)

*Primary Examiner* — Michael Pervan
(74) *Attorney, Agent, or Firm* — Lewis Roca Rothgerber Christie LLP

(57) ABSTRACT

A display device may include a substrate, a display element portion on a surface of the substrate, the display element portion including a plurality of display pixels, a color conversion portion on the display element portion, the color conversion portion including a plurality of banks and a wavelength conversion pattern between the plurality of banks, and a sensor electrode configured to obtain information of a touch input. The sensor electrode may include a first conductive layer arranged on at least a part of a surface of the plurality of banks.

22 Claims, 10 Drawing Sheets

(56) References Cited

U.S. PATENT DOCUMENTS

2021/0036076 A1* 2/2021 Kim ............... H01L 27/3258
2021/0091151 A1* 3/2021 Lee ............... H01L 27/3246
2021/0091163 A1* 3/2021 Son ............... G09G 3/32

* cited by examiner

DISPLAY DEVICE

CROSS-REFERENCE TO RELATED APPLICATION

This application claims priority to and the benefit of Korean Patent Application No. 10-2020-0089068, filed in the Korean Intellectual Property Office (KIPO) on Jul. 17, 2020, the entire content of which is incorporated by reference herein.

BACKGROUND

1. Field

The present disclosure relates to a display device.

2. Description of the Related Art

Recently, a display device including a touch sensor (which is an input device configured to receive a touch input from a user) is widely used. In general, the touch sensor included in the display device is provided (manufactured) from the outside of the display device and then attached to the display device, or is provided inside the display device.

However, when the touch sensor is provided in advance and attached to the display device, an additional attachment process may be required, and thus a process cost may be increased. In addition, a configuration related to a sensor electrode may be observed from the outside, and thus visibility may worsen. In order to compensate for this, when the touch sensor is included in the display device, it may be desirable to improve visibility for the display device.

Moreover, there is a continuous demand for improving light emission efficiency of the display device, and thus, research for increasing the light emission efficiency of the display device has been continuously conducted.

SUMMARY

Aspects of one or more embodiments of the present disclosure are directed towards a display device configured to perform a touch sensor function and having improved light emission efficiency.

The objects of the present disclosure are not limited to the objects which are described above, and other technical objects which are not mentioned will be clearly understood by those skilled in the art from the following description.

According to an embodiment of the present disclosure a display device may be provided. The display device may include a substrate, a display element portion on a surface of the substrate, the display element portion including a plurality of display pixels, a color conversion portion on the display element portion, the color conversion portion including a plurality of banks and a wavelength conversion pattern between the plurality of banks, and a sensor electrode configured to obtain information of a touch input. The sensor electrode may include a first conductive layer arranged on at least a part of a surface of the plurality of banks.

The sensor electrode may further include a plurality of first sensor patterns forming a first line along a first direction, and a plurality of second sensor patterns forming a second line along a second direction different from the first direction.

A first one of the plurality of first sensor patterns may be at least a portion of the first conductive layer, and a first one of the plurality of second sensor patterns may be another portion of the first conductive layer.

The first conductive layer may overlap at least one of the plurality of banks in a plan view.

The first conductive layer included in the sensor electrode may be arranged in a mesh pattern.

At least a portion of the first conductive layer may electrically connect adjacent ones of the plurality of first sensor patterns to each other.

The display device may include a light emitting area and a non-light emitting area, the light emitting area and the non-light emitting area may be separated from each other by at least one of the plurality of banks, and the first conductive layer may be in the non-light emitting area.

At least a portion of the first conductive layer may be on a side surface of the plurality of banks.

The display device may further include a second conductive layer different from the first conductive layer.

The display device may further include a capping layer between the first conductive layer and the second conductive layer.

The first conductive layer and the second conductive layer may be electrically connected to each other through a contact hole in the capping layer.

The second conductive layer may be between the first conductive layer and the display element portion.

The second conductive layer may overlap at least one of the plurality of banks in a plan view.

The first conductive layer and the second conductive layer may include a metal.

At least a portion of the second conductive layer may electrically connect adjacent ones of the plurality of second sensor patterns to each other.

The first conductive layer and the second conductive layer may overlap each other in a plan view.

The wavelength conversion pattern may include at least one of a quantum dot, a quantum rod, or a phosphor.

The display device may further include a filling layer between the first conductive layer and the display element portion.

The display device may further include a color filter portion including a color filter to selectively transmit light having a specific wavelength.

A display pixel of the plurality of display pixels may be at least one of an organic light emitting diode, an inorganic light emitting diode, or a diode. The display pixel including organic and inorganic compounds.

Aspects (solutions) of the present disclosure are not limited to the above-described aspects (solutions), and suitable aspects (solutions) which are not described will be clearly understood by those skilled in the art from the present specification and the accompanying drawings.

According to an embodiment of the present disclosure, a display device that performs a touch sensor function and has improved light emission efficiency by implementing a light recycling mechanism may be provided.

The effect of the present disclosure is not limited to the above-described effects, and suitable effects which are not described will be clearly understood by those skilled in the art from the present specification and the accompanying drawings.

BRIEF DESCRIPTION OF THE DRAWINGS

The above and other features of the present disclosure will become more apparent by describing in further detail embodiments thereof with reference to the accompanying drawings, in which.

DETAILED DESCRIPTION

Figure 1:
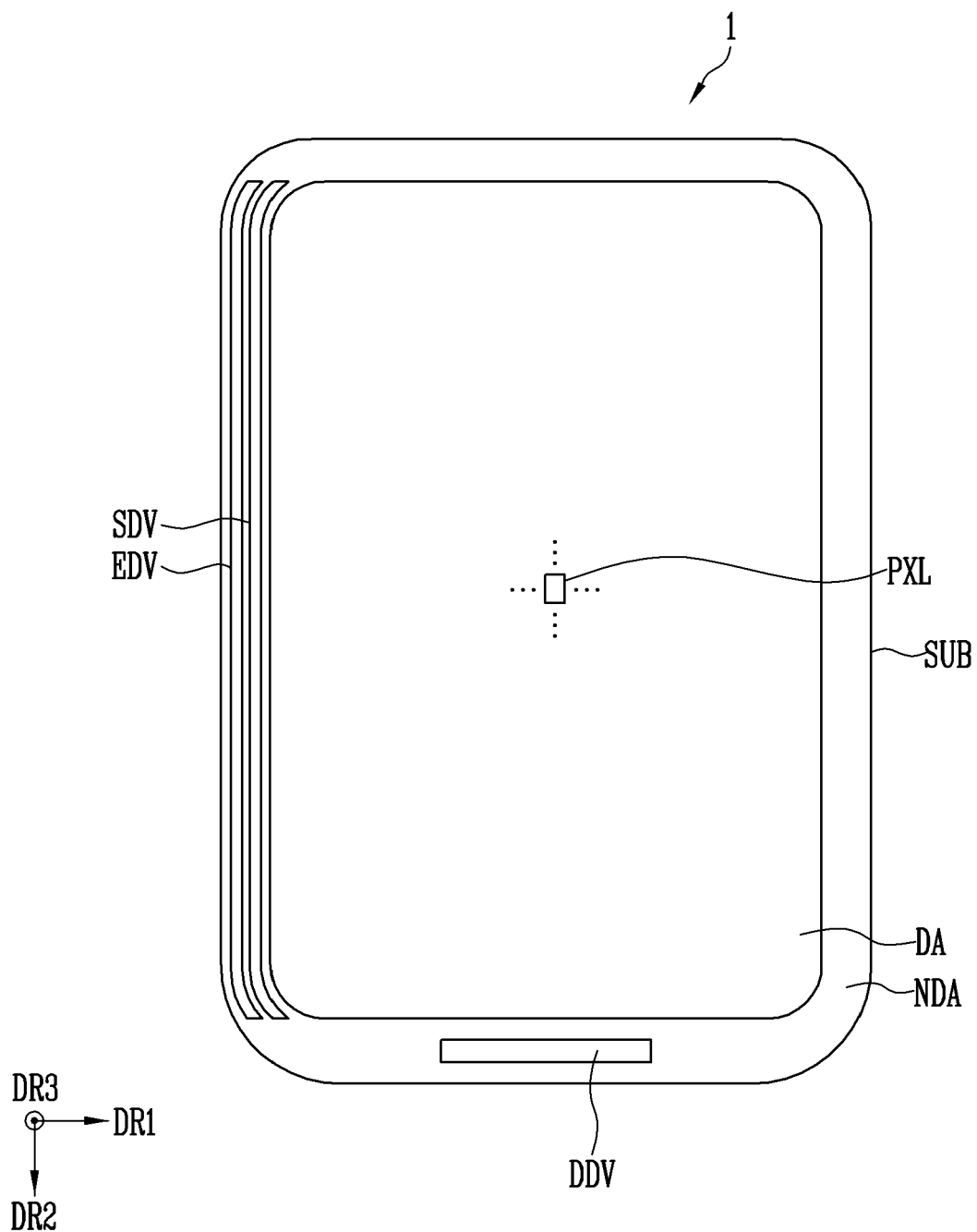
FIG. 1 is a diagram illustrating a display device according to an embodiment.

The present disclosure will now be described more fully with reference to the accompanying drawings in which example embodiments of the present disclosure are shown. However, it is to be understood that the present disclosure is not intended to be limited to the specific forms set forth herein, and the scope of the present disclosure should be interpreted as including all changes, equivalents, modifications or variations that do not depart from the spirit of the present disclosure.

The terminology used herein is for the purpose of describing particular example embodiments only and is not intended to limit the example embodiments described herein.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The drawings of the present disclosure are intended to more fully describe the present disclosure. Because the relative sizes of elements, layers, regions, and shapes shown in the drawings may be exaggerated and/or simplified to help understanding of the present disclosure, the present disclosure is not limited to the drawings.

In the present specification, when it is determined that detailed description of a known configuration or function related to the present disclosure may obscure the subject matter of the present disclosure, detailed description thereof may be omitted.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on" or "connected to" another element, it may be directly on, or connected to the other element or one or more intervening elements may also be present. When an element is referred to as being "directly on" or "directly connected to" another element, there are no intervening elements present.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The present disclosure relates to a display device, and more particularly, to a display device configured to receive a touch input.

Hereinafter, a display device according to embodiments of the present disclosure are described with reference to FIGS. 1-12.

FIG. 1 is a diagram illustrating a display device according to an embodiment.

The display device 1 refers to a device configured to provide visual data to a user. For example, the display device 1 may be a smart phone, a tablet PC, a large screen device, a mobile phone, a video phone, an e-book reader, a desktop PC, a laptop PC, a netbook computer, a workstation, a server, a personal digital assistant (PDA), a portable multimedia player (PMP), an MP3 player, a medical device, a camera, or a wearable device, but the present disclosure is not limited thereto.

Referring to FIG. 1, the display device 1 may include a substrate SUB, a plurality of pixels PXLs including a pixel PXL, drivers SDV, EDV, and DDV, and a line portion. The drivers SDV, EDV, and DDV may include a scan driver SDV, a light emission driver EDV, and a data driver DDV.

The substrate SUB may include a display area DA and a non-display area NDA.

The pixel PXL may be positioned on the substrate SUB. The pixel PXL may be positioned in the display area DA. In the display area DA, light may be emitted in a third direction DR3. The plurality of pixels PXL may be arranged in a matrix form according to a row extending along a first direction DR1 and a column extending along a second direction DR2.

The pixel PXL may include a light emitting element (e.g., see the light emitting element LD of FIG. 2) that may emit light when an electrical signal is applied.

At least one of the scan driver SDV, the light emission driver EDV, or the data driver DDV may be positioned in the non-display area NDA together with the line portion.

The substrate SUB may include a rigid material and/or a flexible material according to a purpose of the display device 1. However, the present disclosure is not limited thereto. For example, the material of the substrate SUB may be any suitable material.

The scan driver SDV, the light emission driver EDV, and the data driver DDV may be positioned in the non-display area NDA in a plan view. The scan driver SDV, the light emission driver EDV, and the data driver DDV may output electrical information to the pixel PXL. When the electrical information is provided to the pixel PXL, the light emitting element LD included in the pixel PXL may emit light.

The scan driver SDV may provide or transfer a scan signal to the pixel PXL along or through a scan line.

The light emission driver EDV may provide a light emission control signal to the pixel PXL along or through a light emission control line.

The data driver DDV may provide a data signal to the pixel PXL along or through a data line.

The line portion may be positioned in the non-display area NDA on the plan view. The line portion may connect (e.g., electrically connect) any one of the drivers and the pixel PXL.

Figure 2:
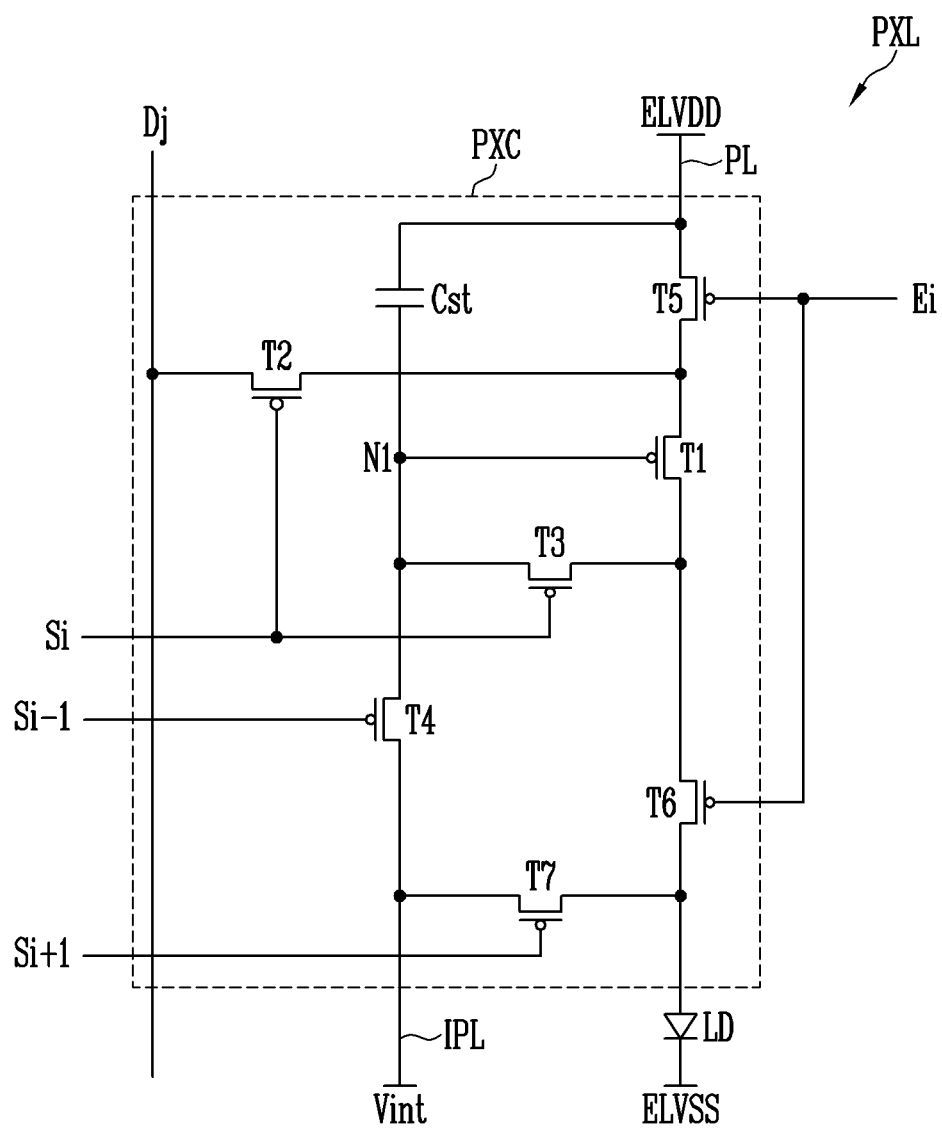
FIG. 2 is a diagram illustrating a pixel driving circuit of a pixel included in the display device according to an embodiment.

FIG. 2 is a diagram illustrating a pixel driving circuit of a pixel included in the display device according to an embodiment.

Each pixel PXL included in the display device 1 according to an embodiment of the present disclosure may include a pixel driving circuit PXC.

The pixel driving circuit PXC may include first to seventh transistors T1 to T7 (a first transistor T1, a second transistor T2, a third transistor T3, a fourth transistor T4, a fifth transistor T5, a sixth transistor T6, and a seventh transistor T7) and a storage capacitor Cst. The pixel driving circuit PXC may be connected (e.g., electrically connected) to the light emitting element LD.

A first electrode of the first transistor T1 may, through the fifth transistor T5, be connected to a power line PL to which a first power (voltage) of a first power supply (source) ELVDD is applied, and a second electrode of the first transistor T1 may be connected to an anode electrode of the light emitting element LD through the sixth transistor T6. The first transistor T1 may control current data flowing from the first power supply ELVDD to the second power supply (source) ELVSS through the light emitting element LD based on information on a voltage of a first node N1. The first transistor T1 may be a driving transistor.

The second transistor T2 may be connected between the first electrode of the first transistor T1 and a j-th data line Dj. A gate electrode of the second transistor T2 may be connected to an i-th scan line Si. The second transistor T2 may be turned on when a scan signal is applied from the i-th scan line Si, and may connect (e.g., electrically connect) the j-th data line Dj and the first electrode of the first transistor T1. The second transistor T2 may be a switching transistor.

The third transistor T3 may be connected between the second electrode of the first transistor T1 and the first node N1. The third transistor T3 may be turned on when a scan signal of a gate-on voltage is applied from the i-th scan line Si, and may connect (e.g., electrically connect) the second electrode of the first transistor T1 and the first node N1.

The fourth transistor T4 may be connected between the first node N1 and an initialization power line IPL to which an initialization power (voltage) from an initialization power supply (source) Vint is applied. A gate electrode of the fourth transistor T4 may be connected to an (i−1)-th scan line (Si−1). The fourth transistor T4 may be turned on when a scan signal is applied to the (i−1)-th scan line (Si−1), to supply a voltage from the initialization power supply Vint to the first node N1. The fourth transistor T4 may be an initialization transistor.

The fifth transistor T5 may be connected between a power line PL to which the first power from the first power supply ELVDD is applied and the first transistor T1. A gate electrode of the fifth transistor T5 may be connected to an i-th light emission control line Ei. The fifth transistor T5 may be turned off when a light emission control signal of a gate-off voltage (e.g., a high level voltage) is applied from the i-th light emission control line Ei, and may be turned on in other cases. For example, the fifth transistor T5 may be turned on when a low level voltage is applied to the gate electrode of the sixth transistor T5.

The sixth transistor T6 may be connected between the first transistor T1 and the light emitting element LD. A gate electrode of the sixth transistor T6 may be connected to the i-th light emission control line Ei. The sixth transistor T6 may be turned off when a light emission control signal of a gate-off voltage (e.g., a high level voltage) is applied from the i-th light emission control line Ei, and may be turned on in other cases. For example, the sixth transistor T6 may be turned on when a low level voltage is applied to the gate electrode of the sixth transistor T6.

The seventh transistor T7 may be connected between the initialization power line IPL and the anode electrode of the light emitting element LD. A gate electrode of the seventh transistor T7 may be connected to an (i+1)-th scan line Si+1. The seventh transistor T7 may be turned on when a scan signal of a gate-on voltage (e.g., a low level voltage) is applied from the (i+1)-th scan line Si+1, to supply a voltage from the initialization power supply Vint to the anode electrode of the light emitting element LD. In FIG. 2, the gate electrode of the seventh transistor T7 is connected to the (i+1)-th scan line Si+1, but the present disclosure is not limited thereto. For example, the gate electrode of the seventh transistor T7 may be connected to the i-th scan line Si. In this case, the seventh transistor T7 is turned on by the scan signal of the gate-on voltage applied from the i-th scan line Si.

The voltage from the initialization power supply Vint may be set to a voltage lower than a data signal. For example, the voltage from the initialization power supply Vint may be set to be equal to or lower than a minimum voltage of the data signal.

The storage capacitor Cst may be connected between the power line PL to which the first power of the first power supply ELVDD is applied and the first node N1. The storage capacitor Cst may store information on a data signal and a voltage corresponding to a threshold voltage of the first transistor T1.

The anode electrode of the light emitting element LD may be connected to the first transistor T1 through the sixth transistor T6. A cathode electrode of the light emitting element LD may be connected to the second power supply ELVSS.

The light emitting element LD may emit light of a set (e.g., predetermined) luminance corresponding to a current amount supplied from the first transistor T1. A voltage value of the first power of the first power supply ELVDD may be set to be higher than a voltage value of the second power of the second power supply ELVSS so that a current flows to (through) the light emitting element LD.

The light emitting element LD may be configured of (i.e., formed of) or include an organic light emitting diode, or an inorganic light emitting diode such as a micro light emitting diode or a quantum dot light emitting diode. Alternatively, the light emitting element LD may be a light emitting element configured of or including a combination of organic and inorganic materials.

In FIG. 2, the pixel PXL includes a single light emitting element LD. However, the present disclosure is not limited thereto. For example, in another embodiment, the pixel PXL may include a plurality of light emitting elements LD, and the light emitting elements LD may be connected to each other in series, in parallel, or in series and parallel.

Additionally, in FIG. 2, the pixel PXL is driven using the signals of the i-th scan line (Si), the (i−1)-th scan line (Si-1), and the (i+1)-th scan line (Si+1), but the present disclosure is not limited thereto. For example, the i-th scan line (Si), the (i−1)-th scan line (Si-1), and the (i+1)-th scan line (Si+1) may be separate signal lines supplied with scan signals from different scan drivers SDV, respectively.

Hereinafter, for convenience, the light emitting element LD included in the display device 1 is described as an organic light emitting diode, but the present disclosure is not limited thereto. For example, the light emitting element LD may be a different type of light emitting element.

Figure 3:
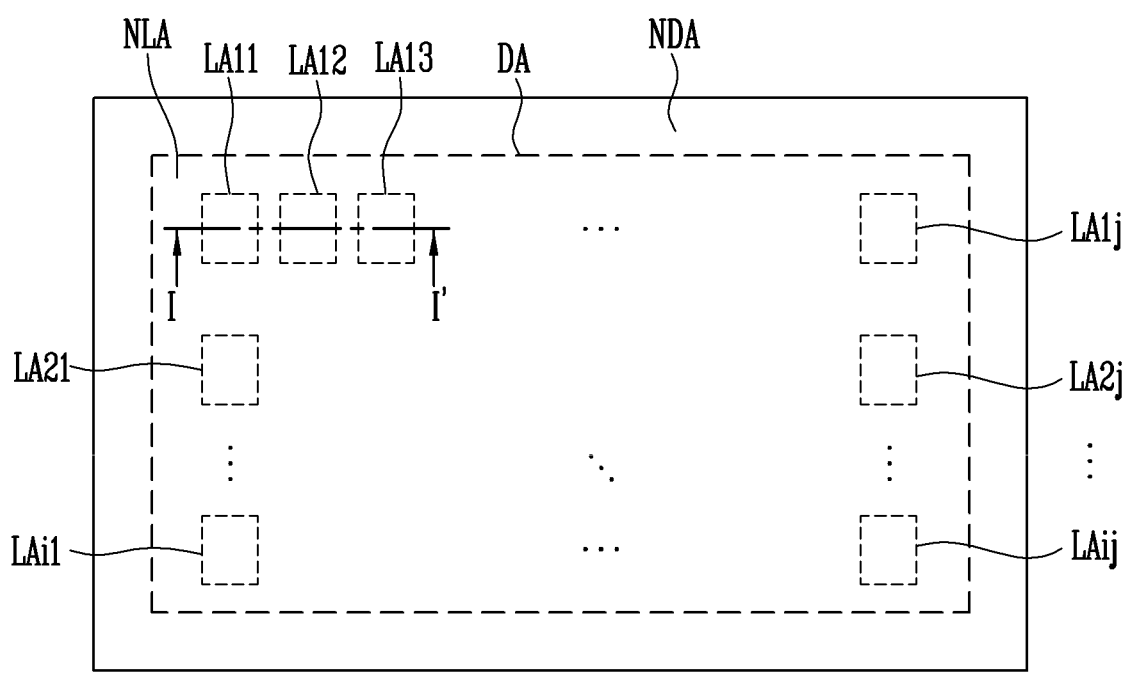
FIG. 3 is a plan view illustrating one surface of the display device according to an embodiment.
Figure 3:

FIG. 3 is a plan view illustrating one surface of the display device according to an embodiment.

The display area DA may include a light emitting area LA and a non-light emitting area NLA.

The light emitting area LA may include a plurality of light emitting areas LA11 to LAij. The plurality of light emitting areas LA11 to LAij may be arranged in a form of an i*j matrix (where i and j are natural numbers referring respectively to the row and column of an i*j matrix). Hereinafter, as an exemplary light emitting area, description is given based on a first light emitting area LA11 which is a light emitting area of a first row and a first column, a second light emitting area LA12 which is a light emitting area of the first row and a second column, and a third light emitting area LA13 which is a light emitting area of the first row and a third column.

The non-light emitting area NLA may be an area for distinguishing the plurality of light emitting areas LA11 to LAij in the display area DA. For example, the non-light emitting area NLA may be defined as an area in which light is not emitted in the display area DA. The non-light emitting area NLA may be provided in a form surrounding the plurality of light emitting areas LA11 to LAij.

The pixel PXL may include a first display pixel, a second display pixel, and a third display pixel. The first display pixel may correspond to the first light emitting area LA11. The second display pixel may correspond to the second light emitting area LA12. The third display pixel may correspond to the third light emitting area LA13.

According to an example, the first display pixel may emit red light, and the red light may be output in the first light emitting area LA11. The second display pixel may emit green light, and the green light may be output in the second light emitting area LA12. The third display pixel may emit blue light, and the blue light may be output in the third light emitting area LA13. However, the present disclosure is not limited thereto.

For example, according to an embodiment, in at least one of the plurality of light emitting areas LA11 to LAij, white light may be emitted, or cyan, magenta, or yellow light may be emitted. Hereinafter, a case where the light emitting area LA of the display device 1 include the first light emitting area LA11, the second light emitting area LA12, and the third light emitting area LA13 that emit the red light, the green light, and the blue light, respectively, is described as an example. However, it is understood that types and a disposition sequence (e.g., arrangement) of the colors of the first light emitting area LA11, the second light emitting area LA12, and the third light emitting area LA13 are not limited thereto.

Hereinafter, a structure of the display device 1 is described with reference to a cross-sectional view of a partial area of the display device 1. However, for convenience of description, description is given based on a transistor configuration corresponding to the sixth transistor T6 among the first to seventh transistors T1 to T7 shown in FIG. 2.

Figure 4:
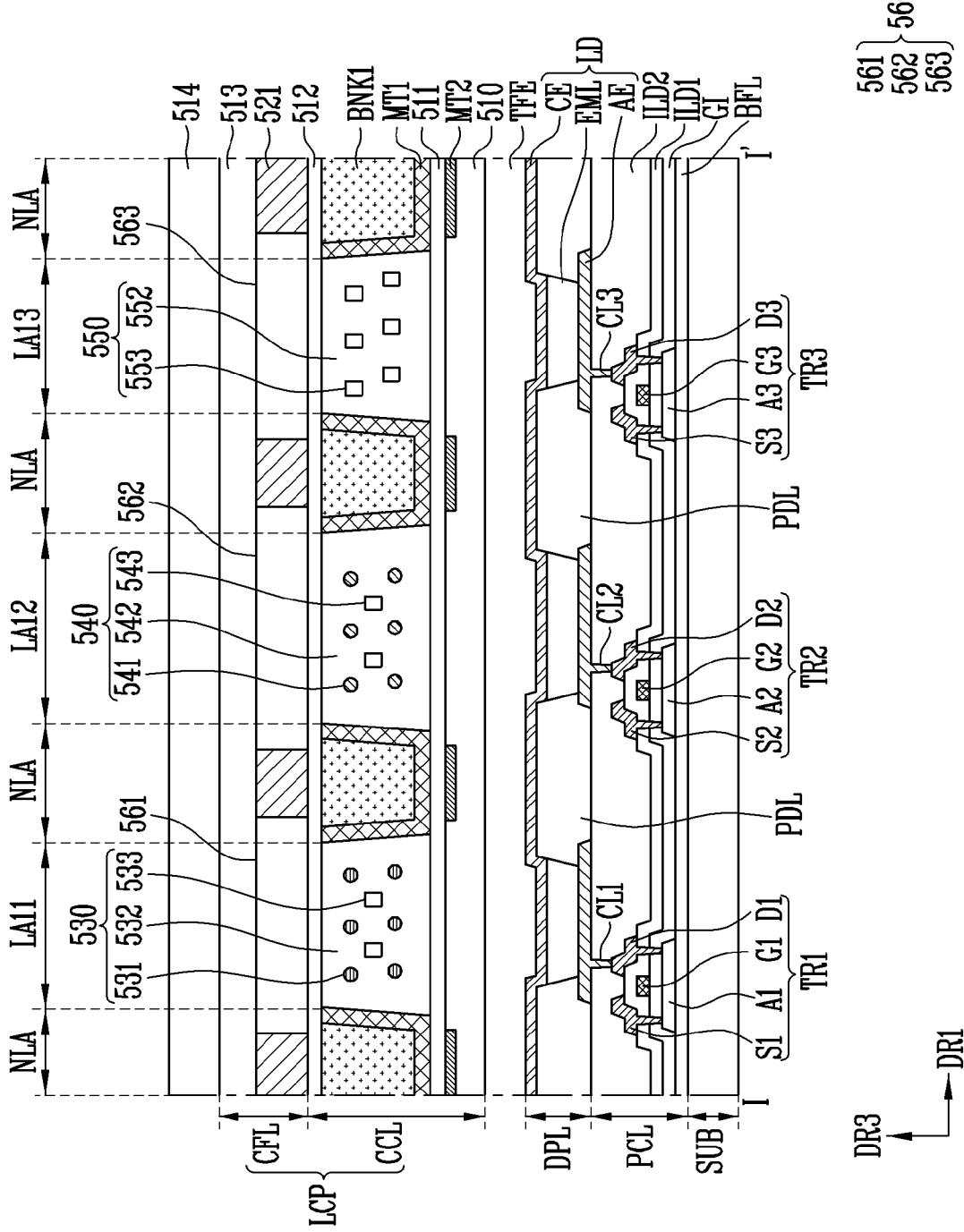
FIG. 4 is a cross-sectional view taken along the line I-I' of FIG. 3.

FIG. 4 is a cross-sectional view taken along the line I~I' of FIG. 3.

Referring to FIG. 4, the display device 1 may include a substrate SUB, a pixel circuit portion PCL, a display element portion DPL, a thin film encapsulation film TFE, a light control portion LCP, and an upper substrate 514. The light control portion LCP may include a color conversion portion CCL and a color filter portion CFL.

The substrate SUB may include a rigid material and/or a flexible material. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. However, the material of the substrate SUB applied to an embodiment of the present disclosure is not limited thereto.

The pixel circuit portion PCL may include a buffer film BFL, a gate insulating film GI, a first interlayer insulating film ILD1, a plurality of switching elements TR1, TR2, and TR3, a second interlayer insulating film ILD2, and a plurality of conductive lines CL1, CL2, and CL3. The pixel circuit portion PCL may be positioned on the substrate SUB.

The buffer film BFL may be positioned on the substrate SUB. The buffer film BFL may prevent or substantially prevent an impurity from diffusing from the outside. The buffer film BFL may include one or more metal oxides (such as silicon nitride (SiNx), silicon oxide (SiOx), silicon oxynitride (SiOxNy), and/or aluminum oxide (AlOx)).

The plurality of switching elements including a first switching element TR1, a second switching element TR2, and a third switching element TR3 may be disposed on the buffer film BFL. The plurality of switching elements TR1, TR2, and TR3 may be thin film transistors, and according to an example, may be driving transistors of the thin film transistors. Each of the plurality of switching elements TR1, TR2, and TR3 may correspond to the sixth transistor T6 described above with reference to FIG. 2. For example, the first switching element TR1, the second switching element TR2, and the third switching element TR3 may be the sixth transistors T6 of the first display pixel corresponding to the first light emitting area LA11, the second display pixel corresponding to the second light emitting area LA12, and the third display pixel corresponding to the third light emitting area LA13 respectively.

Each of the plurality of switching elements TR1, TR2, and TR3 may include semiconductor layers (or semiconductor patterns) A1, A2, and A3, gate electrodes G1, G2, and G3, source electrodes S1, S2, and S3, and drain electrodes D1, D2, and D3.

Hereinafter, for convenience, description of the pixel circuit portion PCL is described based on a configuration of the first switching element TR1. The configuration of the first switching element TR1 as described with reference to the pixel circuit portion PCL may be applied to corresponding components of each of the second switching element TR2 and the third switching element TR3, and thus a redundant description of the second switching element TR2 and the third switching element TR3 may not be provided.

The semiconductor layer A1 may be positioned on the buffer film BFL. The semiconductor layer (pattern) A1 may include at least one of polysilicon, amorphous silicon, or an oxide semiconductor.

The semiconductor layer A1 may include a first contact region contacting the source electrode S1 and a second contact region contacting the drain electrode D1.

The first contact region and the second contact region may be semiconductor patterns doped with an impurity. A region between the first contact region and the second contact region may be a channel region. The channel region may be an intrinsic semiconductor pattern in which an impurity is not doped.

The gate insulating film GI may be provided on the semiconductor layer A1. The gate insulating film GI may include an inorganic material. According to an example, the gate insulating film GI may include at least one of silicon nitride (SiNx), silicon oxide (SiOx), silicon oxynitride (SiOxNy), or aluminum oxide (AlOx). According to an embodiment, the gate insulating film GI may include an organic material.

The gate electrode G1 may be positioned on the gate insulating film GI. A position of the gate electrode G1 may correspond to a position of the channel region of the semiconductor layer A1. For example, the gate electrode G1 may be disposed on the channel region of the semiconductor layer A1 with the gate insulating film GI interposed therebetween.

The first interlayer insulating film ILD1 may be positioned on the gate electrode G1. Similar to the gate insulating film GI, the first interlayer insulating film ILD1 may include at least one of silicon nitride (SiNx), silicon oxide (SiOx), silicon oxynitride (SiOxNy), or aluminum oxide (AlOx).

The source electrode S1 and the drain electrode D1 may be positioned on the first interlayer insulating film ILD1. The source electrode S1 may pass through the gate insulating film GI and the first interlayer insulating film ILD1 and contact the first contact region of the semiconductor layer A1. The drain electrode D1 may pass through the gate insulating film GI and the first interlayer insulating film ILD1 and contact the second contact region of the semiconductor layer A1.

The second interlayer insulating film ILD2 may be positioned on the source electrode S1 and the drain electrode D1. The second interlayer insulating film ILD2 may include an inorganic material similar to the first interlayer insulating film ILD1 and the gate insulating film GI. The inorganic material may include at least one of the materials exemplified as a configuration material(s) of the first interlayer insulating film ILD1 and/or the gate insulating film GI, for example, silicon nitride (SiNx), silicon oxide (SiOx), silicon oxynitride (SiOxNy), and/or aluminum oxide (AlOx). According to an embodiment, the second interlayer insulating film ILD2 may include an organic material.

The plurality of conductive lines may include a first conductive line CL1, a second conductive line CL2, and a third conductive line CL3. Each of the plurality of conductive lines CL1, CL2, and CL3 may be connected (e.g., electrically connected) to the drain electrodes D1, D2, and D3 respectively through a corresponding contact hole passing through the second interlayer insulating film ILD2.

The plurality of conductive lines CL1, CL2, and CL3 may each be a path through which an electrical signal may flow. According to an example, the plurality of conductive lines CL1, CL2, and CL3 may include at least one of molybdenum (Mo), tungsten (W), aluminum-neodymium (AlNd), titanium (Ti), aluminum (Al), or silver (Ag).

The display element portion DPL may be disposed on the pixel circuit portion PCL. The display element portion DPL may include a pixel definition film PDL and the light emitting element LD.

The pixel definition film PDL may serve to define the light emitting area LA of each pixel PXL. The pixel definition film PDL may include an organic material. According to an example, the pixel definition film PDL may include at least one of acryl resin, epoxy resin, phenol resin, polyamide resin, or polyimide resin.

The light emitting element LD may include a first electrode AE, a second electrode CE, and a light emitting layer EML.

In one or more embodiments, one of the first and second electrodes AE and CE may be the anode electrode, and the other of the first and second electrodes AE and CE may be the cathode electrode. When the light emitting element LD is a front surface light emitting type organic light emitting diode, the first electrode AE may be a reflective electrode and the second electrode CE may be a transmissive electrode. Hereinafter, a case where the light emitting element LD is the front surface light emitting type (kind) organic light emitting diode, the first electrode AE is the anode electrode, and the second electrode CE is the cathode electrode is described as an example. However, the present disclosure is not limited thereto. For example, the light emitting element LD may be a back surface light emitting type (kind) organic light emitting diode or a dual surface light emitting type (kind) organic light emitting diode.

The first electrode AE may be positioned on the second interlayer insulating film ILD2. The first electrode AE may be connected (e.g., electrically connected) to the first conductive line CL1.

The first electrode AE may include a reflective film that may reflect light, or a transparent conductive film disposed on or under the reflective film. For example, the first electrode AE may be configured of or include multiple films including a lower transparent conductive film formed of indium tin oxide (ITO), the reflective film provided on the lower transparent conductive film and formed of silver (Ag), and an upper transparent conductive film provided on the reflective film and formed of indium tin oxide (ITO).

The light emitting layer EML may be disposed in an opening of the pixel definition film PDL. The area exposed by the opening of the pixel definition film PDL and/or the area where the light emitting layer EML is disposed may be the light emitting areas LA11, LA12, and LA13 in which light is emitted. The light emitting layer EML may include an organic material.

Specifically, the light emitting layer EML may have a multi-layer thin film structure including at least a light generation layer. The light emitting layer EML may include a hole injection layer to inject a hole (holes), a hole transport layer having hole transport properties (e.g., excellent hole transport properties) to increase a chance of recombination of a hole and an electron by suppressing a movement of an electron (electrons) that is not combined in the light generation layer, the light generation layer to emit light by the recombination of the injected electron and hole, a hole blocking layer to suppress a movement of a hole (holes) that is not combined in the light generation layer, an electron transport layer to transport (e.g., smoothly transport) the electron to the light generation layer, and an electron injection layer to inject the electron. When an electrical signal is applied to the light emitting layer EML as described above, light may be emitted.

The second electrode CE may be provided on the light emitting layer EML. The second electrode CE may be provided in a form of a common electrode disposed on a front surface of the substrate SUB, but the present disclosure is not limited thereto. The second electrode CE may include a transparent conductive material such as a transparent conductive oxide. The transparent conductive oxide may be at least one of indium tin oxide (ITO), indium zinc oxide (IZO), aluminum zinc oxide (AZO), gallium doped zinc oxide (GZO), zinc tin oxide (ZTO), gallium tin oxide (GTO), indium gallium zinc oxide (IGZO), or fluorine doped tin oxide (FTO). According to an embodiment, when the light emitting element LD is a back surface light emitting type organic light emitting diode, the second electrode CE may include translucent conductive material such as magnesium (Mg), silver (Ag), or an alloy of magnesium (Mg) and silver (Ag).

The color conversion portion CCL may include a filling layer 510, a first metal portion MT1, a second metal portion MT2, a first capping layer 511, a second capping layer 512, a first bank BNK1, a plurality of wavelength conversion patterns 530 and 540, and a light transmission pattern 550. The plurality of wavelength conversion patterns 530 and 540 may include a first wavelength conversion pattern 530 and a second wavelength conversion pattern 540.

The filling layer 510 may be positioned between (e.g., between in the third direction DR3) the first capping layer 511 and the thin film encapsulation film TFE. The filling layer 510 may be positioned between (e.g., between in the third direction DR3) the display element portion DPL and the color conversion portion CCL. The filling layer 510 may include resin of epoxy, urethane acrylate, epoxy acrylate and/or silicones (e.g., bisphenol A type epoxy, cycloaliphatic epoxy resin, phenyl silicone resin, rubber, acrylic epoxy resin, aliphatic urethane acrylate, or the like). Alternatively, the filling layer 510 may include a material selected from a group consisting of hexamethyldisiloxanes, octamethyltrisiloxanes, decamethyltetrasiloxanes, dodecamethylpentasiloxanes, polydimethylsiloxanes, and combinations thereof. However, the material included in the filling layer 510 is not limited to the above-described examples, and various suitable filling materials may be applied.

The second metal portion MT2 may be positioned between the first capping layer 511 and the filling layer 510. The second metal portion MT2 may be arranged on one surface of the first capping layer 511. According to an example, the second metal portion MT2 may be positioned on the surface of the first capping layer 511 in contact with the filling layer 510.

The second metal portion MT2 may overlap the first bank BNK1 in a plan view. In other words, the second metal portion MT2 may overlap the first bank BNK1 in the third direction DR3. For example, a plurality of second metal portions MT2 may be provided, and at least one of the plurality of second metal portions MT2 may be arranged on the one surface of the first capping layer 511 corresponding to a position of the first bank BNK1.

The second metal portion MT2 may include at least one of a metal, an alloy thereof, a conductive polymer, a conductive metal oxide, or a nano conductive material. For example, the second metal portion MT2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first capping layer 511 may be positioned on the filling layer 510. The first capping layer 511 may protect the display element portion DPL from an external influence. The first capping layer 511 may include at least one of an inorganic material or an organic material. According to an example, the first capping layer 511 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first bank BNK1 may be positioned between the first capping layer 511 and the second capping layer 512 of the non-light emitting area NLA. The light emitting area LA and the non-light emitting area NLA may be defined by the first bank BNK1 of the color conversion portion CCL. For example, an area in which the first bank BNK1 is disposed may correspond to the non-light emitting area NLA in which light is not emitted.

The first bank BNK1 may define positions of the first wavelength conversion pattern 530, the second wavelength conversion pattern 540, and the light transmission pattern 550. For example, the first wavelength conversion pattern 530 may be positioned in one area surrounded by the first bank BNK1.

The first bank BNK1 may include an organic material or an inorganic material. For example, the first bank BNK1 may include a material having a low light blocking property and/or a reflecting property. Alternatively, the first bank BNK1 may include a light blocking material and/or a reflective material. For example, the first bank BNK1 may include at least one of a photosensitive composition, an organic material, or a metallic material. The material included in the first bank BNK1 is not limited to the above-described example.

The first metal portion MT1 may be arranged on one surface of the first bank BNK1. For example, at least a portion of the first metal portion MT1 may be arranged on an upper surface of the first bank BNK1 facing the second metal portion MT2. That is, the first metal portion MT1 may overlap (e.g., overlap in the third direction DR3) the second metal portion MT2 on the upper surface of the first bank BNK1. In addition, another portion of the first metal portion MT1 may be arranged on a side surface of the first bank BNK. According to an embodiment, the first metal portion MT1 may directly cover one surface of the first bank BNK1.

The first metal portion MT1 may be positioned in the non-light emitting area NLA. According to an embodiment, the light emitting area LA and the non-light emitting area NLA may be divided by the first bank BNK1, and the first metal portion MT1 formed on the first bank BNK1 may be disposed in the non-light emitting area NLA in a plan view. For example, the light emitting areas LA11, LA12, and LA13 may be separated from each other by the first banks BNK1 in the non-light emitting areas NLA, and the first metal portion MT1 may be formed on (and below) the first bank BNK1 in the non-light emitting area NLA.

The first metal portion MT1 may be provided on at least a portion of the first bank BNK1, and may form a set (e.g., predetermined) pattern in a plan view. According to an example, the first metal portion MT1 may be provided in a mesh shape in a plan view.

The first metal portion MT1 may include a conductive material, similar to the second metal portion MT2. The first metal portion MT1 may include at least one of a metal, an alloy thereof, a conductive polymer, a conductive metal oxide, or a nano conductive material. For example, the first metal portion MT1 may include at least one of the materials listed with reference to the second metal portion MT2.

In the present specification, the first metal portion MT1 and the second metal portion MT2 may be referred to as a first conductive layer and a second conductive layer, respectively.

The first metal portion MT1 and the second metal portion MT2 may be a path through which an electrical signal for a touch input applied from the outside is provided. According to an embodiment, the first metal portion MT1 may be a conductive pattern configured to obtain information of the touch input, and the second metal portion MT2 may be a bridge pattern connecting (e.g., electrically connecting) between a plurality of first metal portions MT1. Content of a touch sensor including shapes of the first metal portion MT1 and the second metal portion MT2 is described later with reference to FIGS. 5-7, and thus repetitive content may not be repeated.

The first wavelength conversion pattern 530 may be positioned in the first light emitting area LA11 in a plan view. The first wavelength conversion pattern 530 may include a first wavelength conversion material 531, a first base resin 532, and a first scattering body 533.

The first wavelength conversion material 531 may convert a peak wavelength of applied light. According to an example, the first wavelength conversion material 531 may convert blue light into red light having a wavelength of 610 nm to 650 nm.

The first wavelength conversion material 531 may be a quantum dot (QD), a quantum rod, or a phosphor.

In one or more embodiments, the quantum dot may refer to a particulate material that emits light of a specific wavelength while an electron moves (e.g., falls) from a conduction band to a valence band. The quantum dot may be a semiconductor nano crystal material. The quantum dot may have a specific band gap according to composition and a size, and may emit light having a unique wavelength after absorbing light. Non-limiting examples of the semiconductor nano crystal of the quantum dot may include group IV nano crystal, group II-VI compound nano crystal, group III-V compound nano crystal, group IV-VI nano crystal, and/or a combination thereof.

The first base resin 532 may have a high light transmittance and an excellent dispersion characteristic for the first wavelength conversion material 531. For example, the first base resin 532 may include an organic material such as an epoxy resin, an acrylic resin, a cardo resin, or an imide resin.

The first scattering body 533 may have a refractive index different from that of the first base resin 532 and may form an optical interface with the first base resin 532. The first scattering body 533 may be a light scattering particle. According to an example, the first scattering body 533 may be a metal oxide particle or an organic particle.

The second wavelength conversion pattern 540 may be positioned in the second light emitting area LA12 in a plan view. The second wavelength conversion pattern 540 may include a second wavelength conversion material 541, a second base resin 542, and a second scattering body 543.

The second wavelength conversion material 541 may convert a peak wavelength of applied light. According to an example, the second wavelength conversion material 541 may convert blue light into green light having a wavelength of 510 nm to 550 nm.

The second wavelength conversion material 541 may be a quantum dot, a quantum rod, or a phosphor.

The second base resin 542 may have a high light transmittance and an excellent dispersion characteristic for the second wavelength conversion material 541. For example, the second base resin 542 may include an organic material such as an epoxy resin, an acrylic resin, a cardo resin, or an imide resin, similar to the first base resin 532.

The second scattering body 543 may have a refractive index different from that of the second base resin 542 and may form an optical interface with the second base resin 542. The second scattering body 543 may be a light scattering particle.

The light transmission pattern 550 may be positioned in the third light emitting area LA13 in a plan view. The light transmission pattern 550 may include a third base resin 552 and a third scattering body 553.

The third base resin 552 may have a high light transmittance and an excellent dispersion characteristic for the third scattering body 553. For example, the third base resin 552 may include an organic material such as an epoxy resin, an acrylic resin, a cardo resin, or an imide resin, similar to the first base resin 532.

The third scattering body 553 may have a refractive index (index of refraction) different from that of the third base resin 552 and may form an optical interface with the third base resin 552. According to an example, the third scattering body 553 may be a light scattering particle.

The second capping layer 512 may seal the first wavelength conversion pattern 530, the second wavelength conversion pattern 540, and the light transmission pattern 550 together with the first capping layer 511, and thus the second capping layer 512 may prevent or substantially prevent an impurity such as moisture or air from permeating from the outside and damaging or contaminating the first wavelength conversion pattern 530, the second wavelength conversion pattern 540, and/or the light transmission pattern 550. The second capping layer 512 may include at least one of an inorganic material or an organic material similar to the first capping layer 511, and may include at least one of the materials mentioned in the description of the first capping layer 511.

The color filter portion CFL may include a black matrix 521, a color filter of a plurality of color filters 560, and a third capping layer 513. The plurality of color filters 560 may include a first color filter 561, a second color filter 562, and a third color filter 563.

The black matrix 521 may be positioned on the second capping layer 512. The black matrix 521 may be disposed along a boundary of each of the light emitting areas LA11, LA12, and LA13, and may block light transmission. The black matrix 521 may include a light blocking material and/or a reflective material.

Each of the color filters of the plurality of color filters 560 may selectively transmit light having a specific wavelength, and may absorb light having a wavelength different from the specific wavelength. The light passing through a color filter of the plurality of color filters 560 may display one of primary colors such as three primary colors of red, green, and blue. However, the display color of the light passing through the color filter of the plurality of color filters 560 is not limited to a primary color. For example, the display color of the light passing through the color filter of the plurality of color filters 560 may be any one of cyan, magenta, yellow, and white.

The first color filter 561 may be disposed in the first light emitting area LA11. The first color filter 561 may transmit light of a first color, and may absorb light of a second color and light of a third color. The first color filter 561 may include a colorant related to the first color.

The second color filter 562 may be disposed in the second light emitting area LA12. The second color filter 562 may transmit the light of the second color, and may absorb the light of the first color and the light of the third color. The second color filter 562 may include a colorant related to the second color.

The third color filter 563 may be disposed in the third light emitting area LA13. The third color filter 563 may transmit the light of the third color, and may absorb the light of the first color and the light of the second color. The third color filter 563 may include a colorant related to the third color.

The third capping layer 513 may be positioned on the plurality of color filters 560 and/or the black matrix 521.

The third capping layer 513 may protect the color filter portion CFL from an external influence. The third capping layer 513 may include at least one of an inorganic material or an organic material, similar to the first capping layer 511. The third capping layer 513 may be disposed on the plurality of color filters 560 and the black matrix 521 to planarize (e.g., provide a flat or substantially flat surface).

The upper substrate 514 may be disposed on the third capping layer 513. The upper substrate 514 may include a material having a light transmittance. The upper substrate 514 may be a rigid substrate or a flexible substrate. According to an example, the upper substrate 514 may be a window member or an encapsulation substrate. According to an embodiment, the upper substrate 514 may not be included in the display device 1.

Hereinafter, the sensor electrode included in the display device 1 is described in more detail below.

Figure 5:
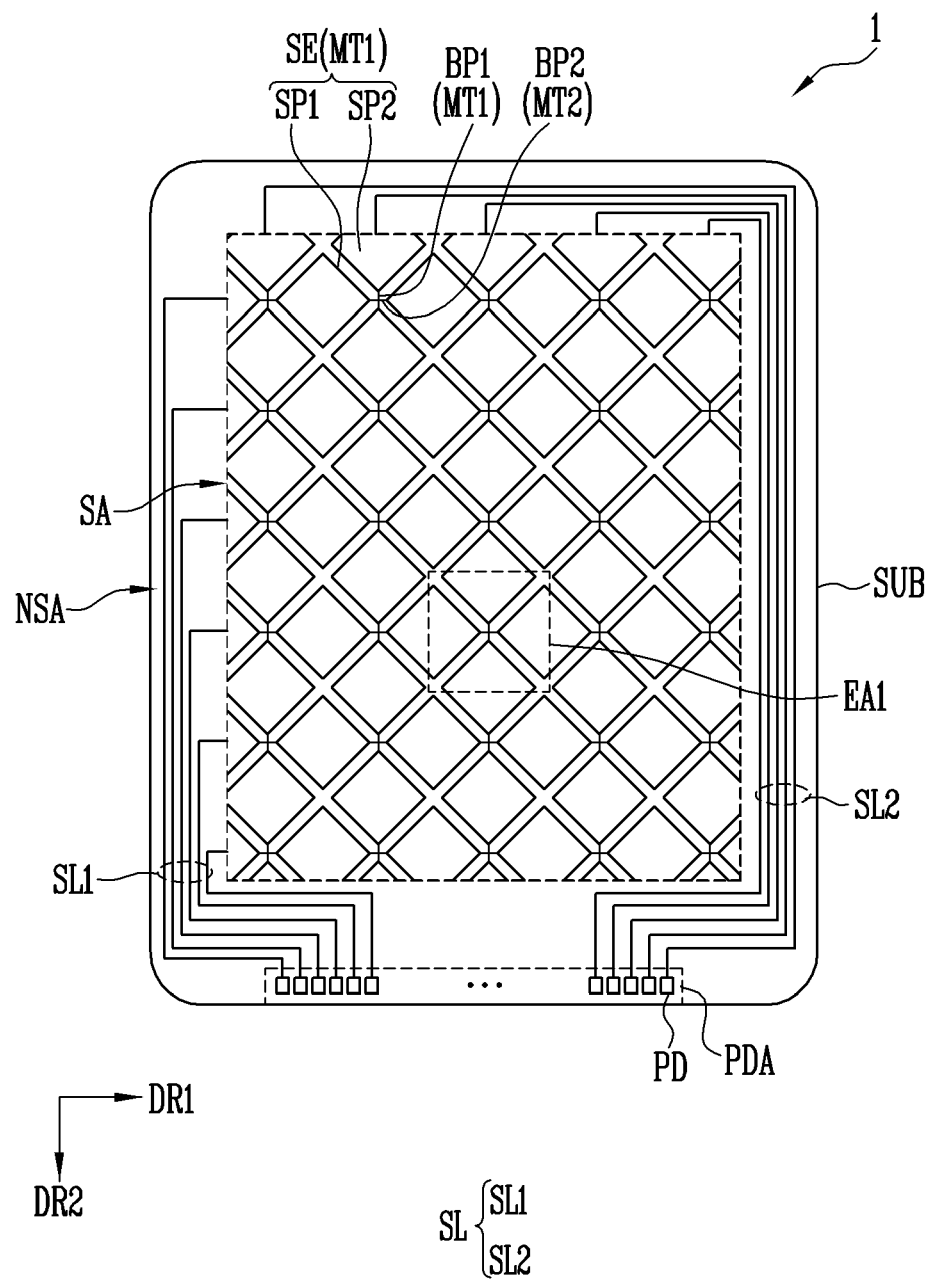
FIG. 5 is a diagram showing a configuration of a sensor electrode included in the display device according to an embodiment.

FIG. 5 is a diagram showing a configuration of the sensor electrode included in the display device according to an embodiment.

The display device 1 may obtain information of an applied touch input. The display device 1 may obtain electrical information of the touch input provided by a user. According to an example, the display device 1 may sense a touch, a hovering, a gesture, proximity or not, and the like by a body part (e.g., a finger) of the user.

The sensor electrode SE may be implemented as at least one of a resistive type (kind or configuration), a capacitive type, an electro-magnetic type, or an optical type. When the sensor electrode SE is implemented as the capacitive type, the sensor electrode SE may be configured in a self-capacitive type or a mutual-capacitive type.

The display device 1 may include a sensing area SA, a non-sensing area NSA, and a pad area PDA.

At least a portion of the sensing area SA may overlap (e.g., overlap in the thickness direction of the display device 1) the display area DA described above with reference to FIG. 1. The sensor electrode SE configured to receive the touch input may be positioned in the sensing area SA.

At least a portion of the non-sensing area NSA may overlap the non-display area NDA described above with reference to FIG. 1. In one or more embodiments, a sensing line SL may be positioned in the non-sensing area NSA. The sensing line SL may be connected (e.g., electrically connected) to the sensor electrode SE and may transmit information on or relating to the touch input. The sensing line SL may include a first sensing line SL1 and a second sensing line SL2. In one or more embodiments, the sensing lines SL may include at least two sensing lines.

The pad area PDA including a pad PD connected (e.g., electrically connected) to the sensing line SL may be disposed on at least a portion of the non-sensing area NSA. A plurality of pads PD may be provided.

The sensor electrode SE may include the first metal portion MT1. The sensor electrode SE may refer to an electrode configuration in a unit pattern area implemented by the first metal portion MT1. That is, the first metal portion MT1 may be arranged in the unit pattern area so that the first sensor pattern SP1 has the set (e.g., predetermined) shape. According to an example, the unit pattern area may be a diamond shape. However, the present disclosure is not limited to a specific shape. For example, the unit pattern area may be any suitable shape.

The sensor electrode SE may include a first sensor pattern SP1 and a second sensor pattern SP2. The display device 1 may obtain information of the touch input of the user based on information on a capacitance change formed between the first sensor pattern SP1 and the second sensor pattern SP2. That is, the first sensor pattern SP1 and the second sensor pattern SP2 may refer to an electrode configuration implemented by connecting the plurality of first metal portions MT1 to each other or combining the plurality of first metal portions MT1 with each other.

A plurality of the first sensor patterns SP1 may form a first line that is connected (e.g., electrically connected) to a corresponding one of a plurality of first sensing lines SL1. According to an example, the first sensor pattern SP1 may form a sensing row line along the first direction DR1. That is, a plurality of first sensor patterns SP1 may be provided in the sensing area SA, and the first sensor patterns SP1 adjacent to each other in the first direction DR1 may be physically separated from each other and may be connected (e.g., electrically connected) to each other.

For example, the first sensor pattern SP1 adjacent to each other in the first direction DR1 may be connected (e.g., electrically connected) by a second bridge pattern BP2. In one or more embodiments, the second bridge pattern BP2 may be substantially the same (e.g., same in material) as the second metal portion MT2. That is, the second bridge pattern BP2 may be implemented based on the second metal portion MT2, and the first sensor patterns SP1 adjacent to each other in the first direction DR1 may be connected (e.g., electrically connected) to each other without an electrical connection by a first bridge pattern BP1. In other words, in one or more embodiments, the first bridge pattern BP1 may not connect (e.g., electrically connect) the first sensor patterns SP1 adjacent to each other in the first direction DR1.

The first sensor pattern SP1 may be arranged in a unit pattern area having a set (e.g., predetermined) shape. According to an example, the first sensor pattern SP1 may be arranged in a pattern area of a rhombus shape. However, the present disclosure is not limited to a specific shape.

Figure 6:
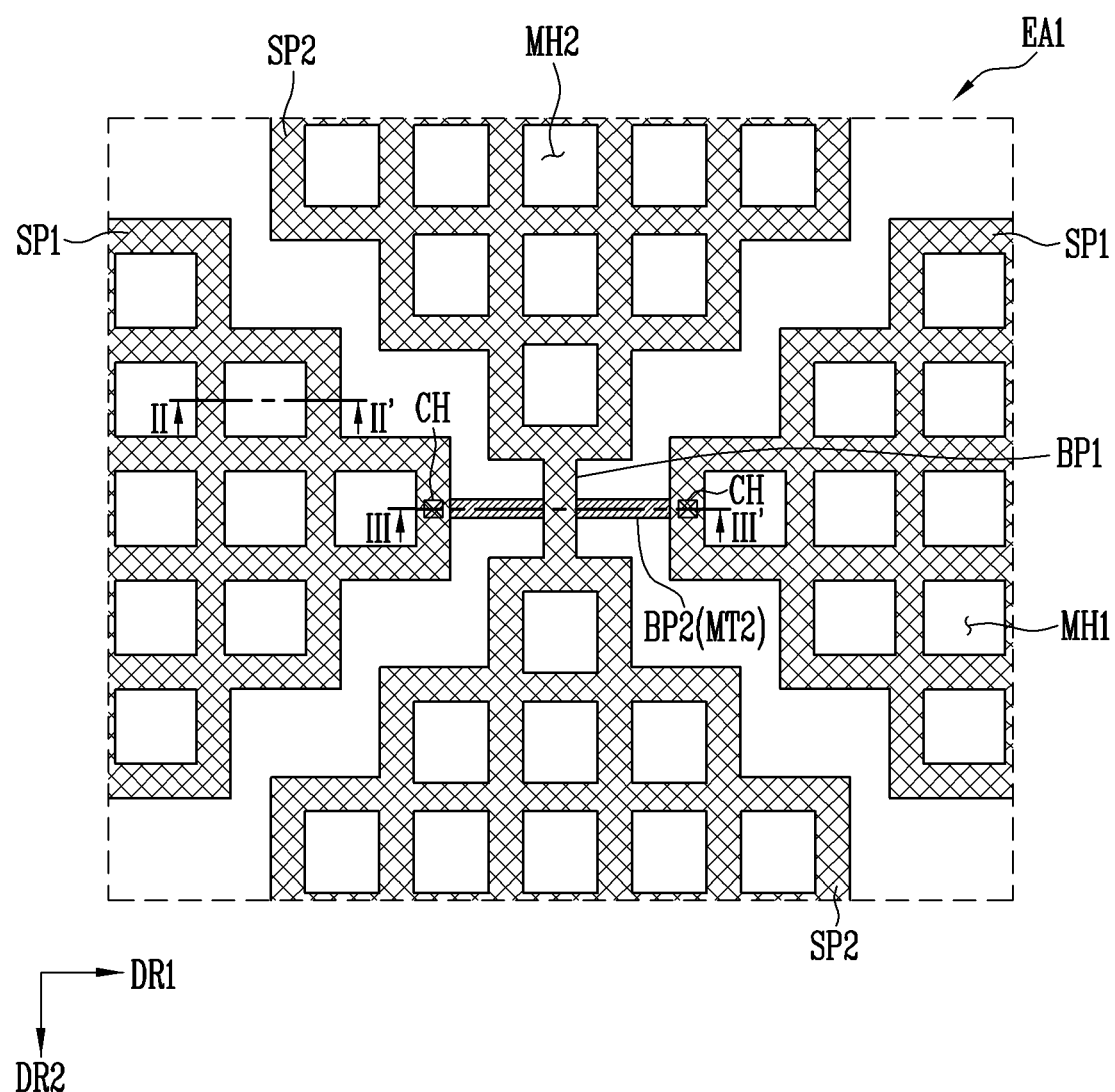
FIG. 6 is an enlarged view of an area EA1 of FIG. 5.

The first sensor pattern SP1 may have a mesh pattern having a plurality of first mesh holes MH1 (e.g., see FIG. 6). In the first sensor pattern SP1, the first metal portion MT1 configuring the first sensor pattern SP1 may be disposed in a mesh pattern, and generally, may form a conductive pattern having a set (e.g., predetermined) shape.

A plurality of the second sensor pattern SP2 may form a second line that is connected (e.g., electrically connected) to a corresponding one of a plurality of second sensing lines SL2. According to an example, the second sensor pattern SP2 may form a sensing column line along the second direction DR2. That is, a plurality of second sensor patterns SP2 may be provided in the sensing area SA, and the second sensor patterns SP2 adjacent to each other in the second direction DR2 may be physically separated from each other and may be connected (e.g., electrically connected) to each other.

In one or more embodiments, the second sensor patterns SP2 adjacent to each other in the second direction DR2 may be connected (e.g., electrically connected) by the first bridge pattern BP1. In one or more embodiments, the first bridge pattern BP1 may also be formed of the first metal portion MT1 similar to the first sensor pattern SP1 and the second sensor pattern SP2. That is, the second sensor patterns SP2 adjacent to each other may be connected (e.g., electrically connected) to each other without an electrical connection by the second metal portion MT2.

The second sensor pattern SP2 may be arranged in a unit pattern area having a set (e.g., predetermined) shape. According to an example, the second sensor pattern SP2 may be arranged in a pattern area of a rhombus shape. However, the present disclosure is not limited thereto.

In one or more embodiments, the second sensor pattern SP2 may have a mesh pattern having a plurality of second mesh holes MH2 (e.g., see FIG. 6). In the second sensor pattern SP2, the first metal portion MT1 may be disposed in a mesh pattern, and generally, may form a conductive pattern having a set (e.g., predetermined) shape.

The first sensor pattern SP1 may be connected (e.g., electrically connected) to the first sensing line SL1 and the pad PD. The second sensor pattern SP2 may be connected (e.g., electrically connected) to the second sensing line SL2 and the pad PD. The first sensor pattern SP1 and the second sensor pattern SP2 may be positioned at the same height, but the present disclosure is not limited thereto.

The first sensing line SL1 may be connected (e.g., electrically connected) to the first sensor pattern SP1. Any one of the first sensing lines SL1 may be connected (e.g., electrically connected) to one sensor row formed by the plurality of first sensor patterns SP1 arranged along the first direction DR1. The first sensing line SL1 may be bent (e.g., bent in the first direction DR1) at least once in the non-sensing area NSA in a plan view. The first sensing line SL1 may include a portion extending along the second direction DR2.

The second sensing line SL2 may be connected (e.g., electrically connected) to the second sensor pattern SP2. Any one of the second sensing lines SL2 may be connected (e.g., electrically connected) to one sensor column formed by the plurality of second sensor patterns SP2 arranged along the second direction DR2. The second sensing line SL2 may be bent at least once in the non-sensing area NSA in a plan view. The second sensing line SL2 may include a portion extending along the first direction DR1.

Hereinafter, a detailed structure and an electrical connection between the first sensor pattern SP1 and the second sensor pattern SP2 are described later with reference to FIG. 6.

FIG. 6 is an enlarged view of an area EA1 of FIG. 5.

As described above, the first sensor pattern SP1 and the second sensor pattern SP2 may be provided in a mesh shape. In FIG. 6, a configuration except for the first sensor pattern SP1 and the second sensor pattern SP2 is omitted.

At least a portion of the first metal portion MT1 forming the first sensor pattern SP1 may form a first line along the first direction DR1, and another portion of the first metal portion MT1 forming the first sensor pattern SP1 may form a second line along the second direction DR2. In one or more embodiments, the first line and the second line may at least partially cross each other and the first mesh hole MH1 may be provided in a plan view.

At least a portion of the first metal portion MT1 forming the second sensor pattern SP2 may form a third line along the first direction DR1, and another portion of the first metal portion MT1 forming the second sensor pattern SP2 may form a fourth line along the second direction DR2. In one or more embodiments, the third line and the fourth line may at least partially cross each other and the second mesh hole MH2 may be provided in a plan view.

According to an embodiment, the first metal portion MT1 configuring the first sensor pattern SP1 and the second metal portion MT2 configuring the second sensor pattern SP2 may not provide a mesh hole, but the present disclosure is not limited thereto.

The first bridge pattern BP1 may connect (e.g., electrically connect) the second sensor patterns SP2 adjacent to each other. The first bridge pattern BP1 may be arranged on the first bank BNK1, as a configuration corresponding to the first metal portion MT1. That is, the second sensor pattern SP2 and the first bridge pattern BP1 may be arranged at the same height.

The second bridge pattern BP2 may connect (e.g., electrically connect) the first sensor patterns SP1 adjacent to each other. That is, the second metal portion MT2 may physically and electrically connect the first sensor patterns SP1 adjacent to each other in the first direction DR1. The second metal portion MT2 may be a metal pattern that is not arranged in the first bank BNK1, as described above with reference to FIG. 4. That is, a first metal portion MT1 and the second metal portion MT2 may be arranged on different layers.

In one or more embodiments, the first sensor pattern SP1 and the second sensor pattern SP2 may be arranged at the same height. However, according to an embodiment, a height of the first bank BNK1 where the second sensor pattern SP2 is positioned and a height of the first bank BNK1 where the first sensor pattern SP1 is positioned may be different from each other, and thus the first sensor pattern SP1 and the second sensor pattern SP2 may be arranged at different heights. Alternatively, a thickness of the first metal portion MT1 configuring the first sensor pattern SP1 and a thickness of the first metal portion MT1 configuring the second sensor pattern SP2 may be different from each other, and thus the first sensor pattern SP1 and the second sensor pattern SP2 may be arranged on different layers.

In addition, as shown in the embodiment of FIG. 6, the first bridge pattern BP1 connects (e.g., electrically connects) between the second sensor patterns SP2 formed in the second direction DR2 and the second bridge pattern BP2 (that is, the second metal portion MT2 connects (e.g., electrically connects) between the first sensor patterns SP1 formed in the first direction DR1). However, the present disclosure is not limited thereto. For example, according to one or more embodiments, the first bridge pattern BP1 may connect (e.g., electrically connect) between the first sensor patterns SP1 formed in the first direction DR1 and the second bridge pattern BP2 may connect (e.g., electrically connect) between the second sensor patterns SP2 formed in the second direction DR2.

Hereinafter, a detailed structure of the sensing electrode according to an embodiment is described later with reference to FIGS. 7-11. For convenience of description, a specific structure and repetitive content of the pixel circuit portion PCL and the display element portion DPL are not repeated, and some structures of the display device 1 including the first metal portion MT1 and the second metal portion MT2 are described in more detail.

Figure 7:
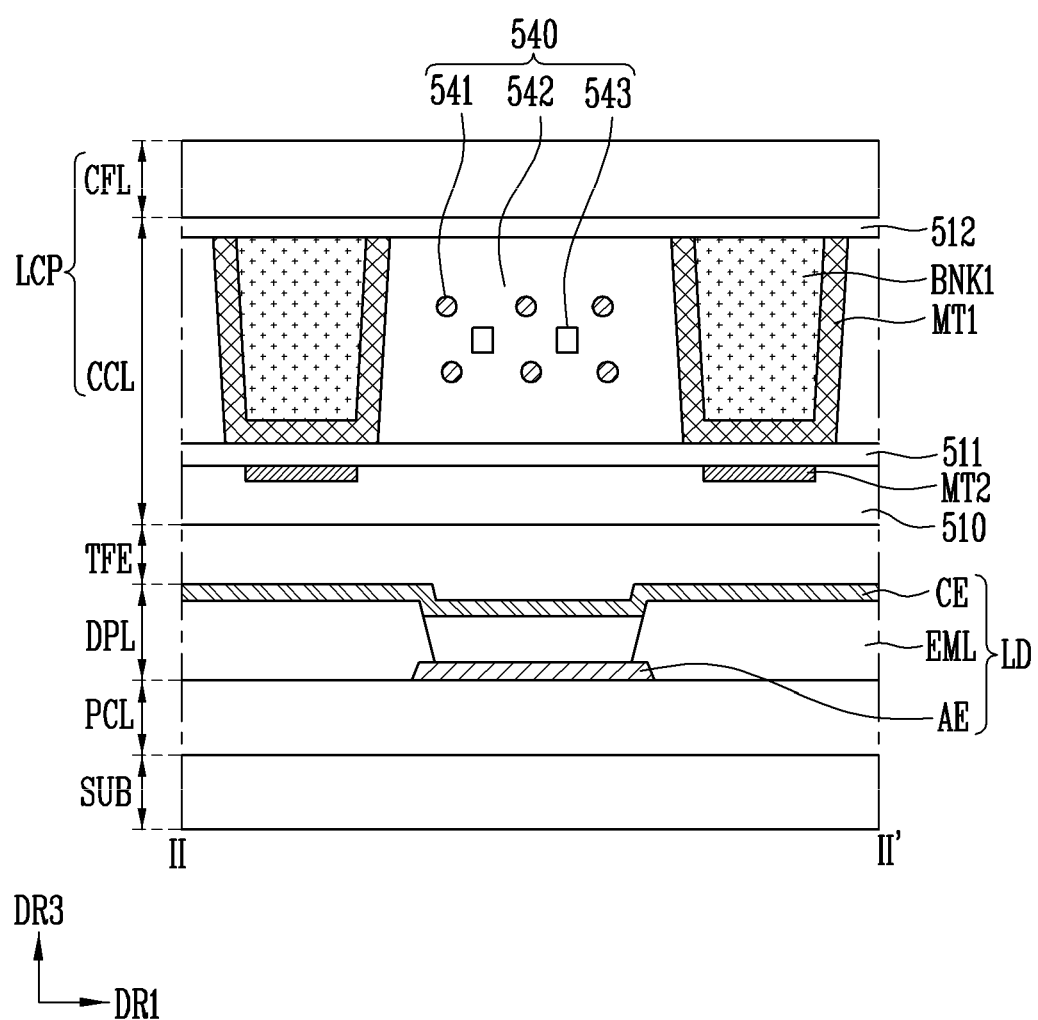
FIGS. 7-9 are cross-sectional views taken along the line II~II' of FIG. 6.
Figure 8:
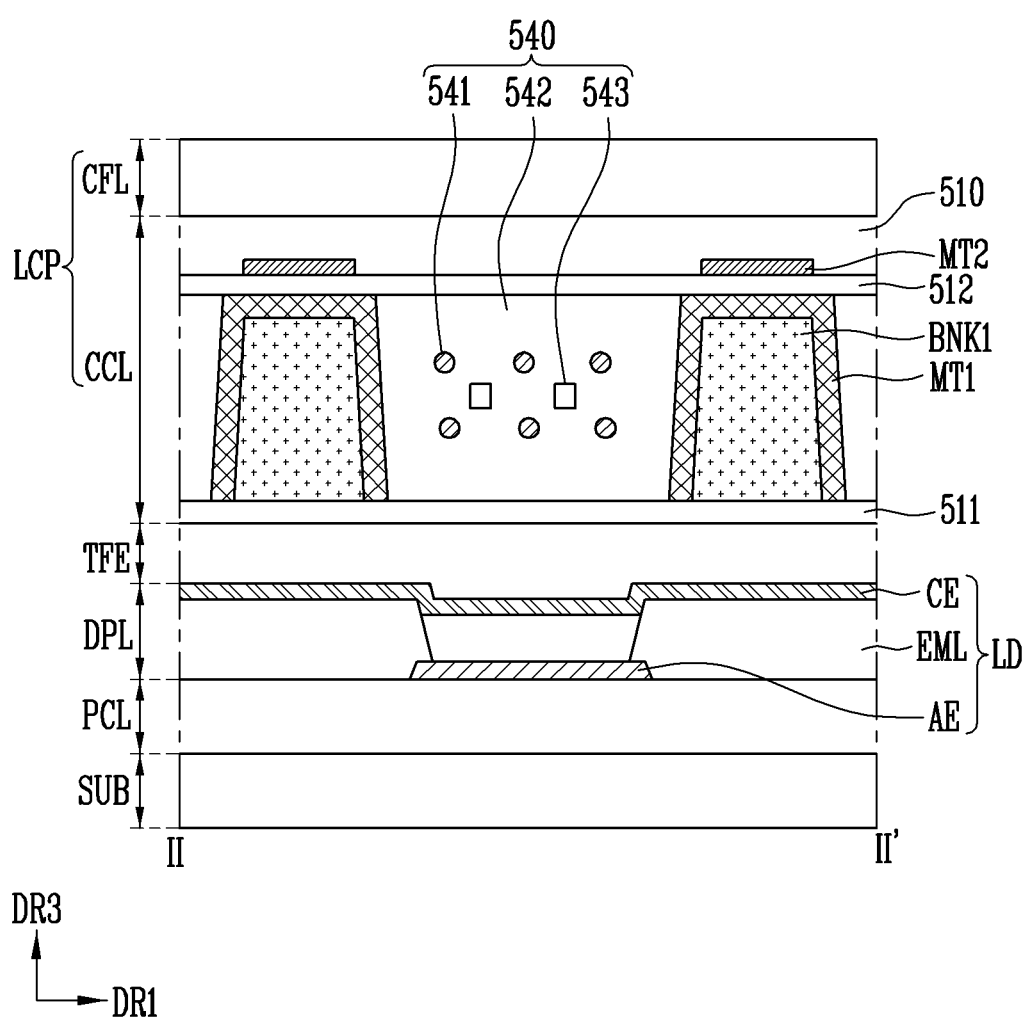
Figure 9:
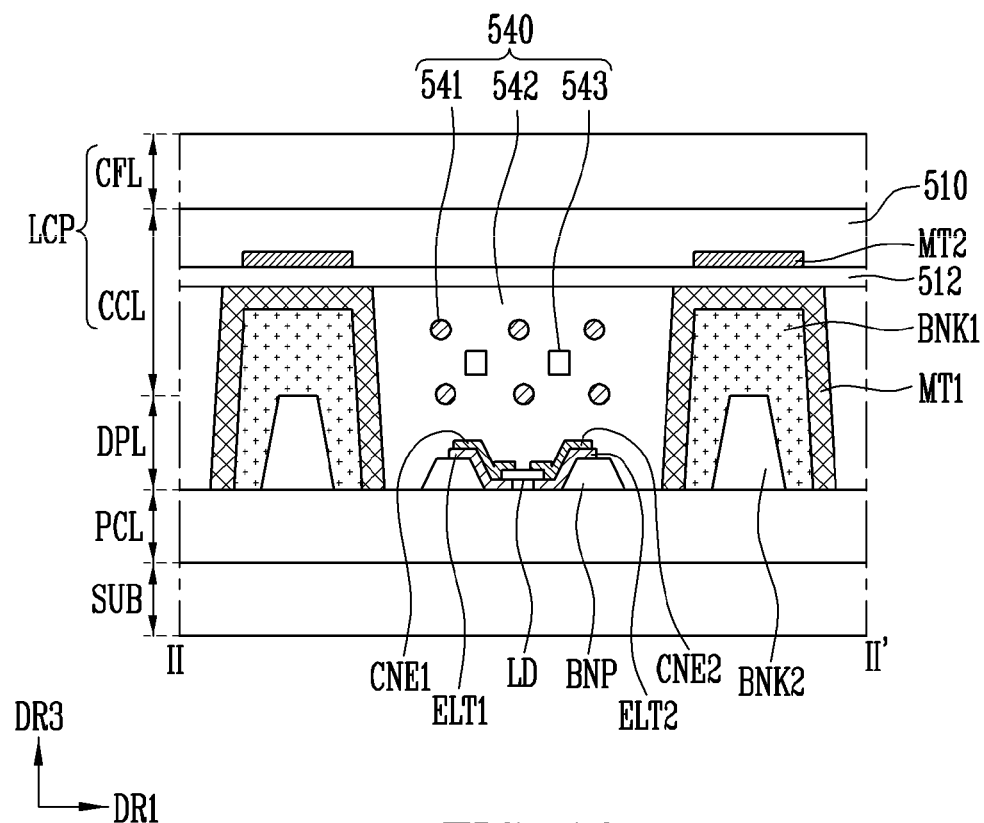

FIGS. 7-9 are cross-sectional views taken along the line II~II' of FIG. 6.

Figure 10:
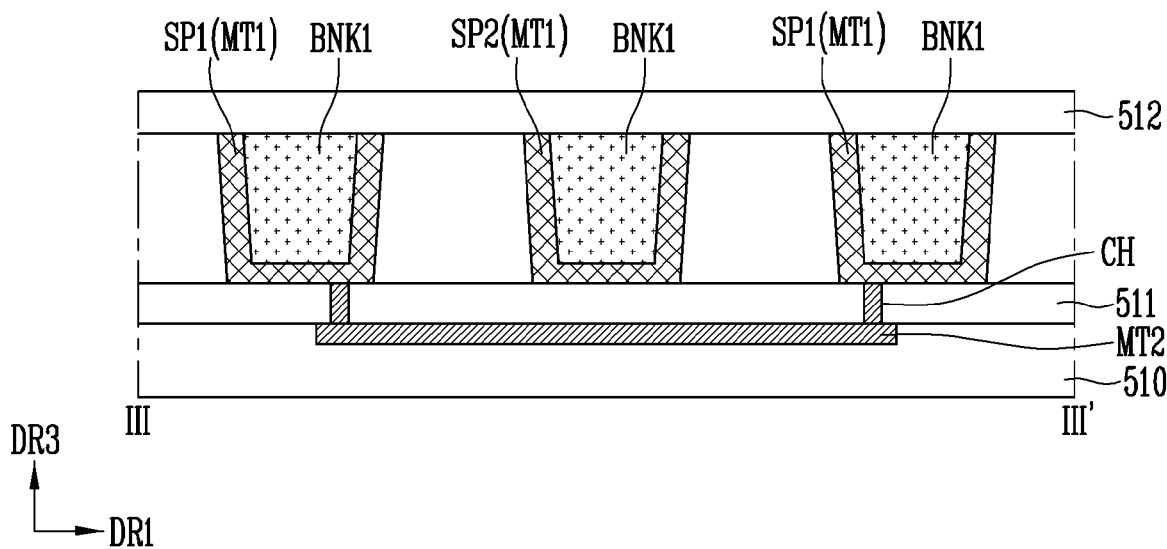
FIGS. 10 and 11 are cross-sectional views taken along the line III~III' of FIG. 6.
Figure 11:
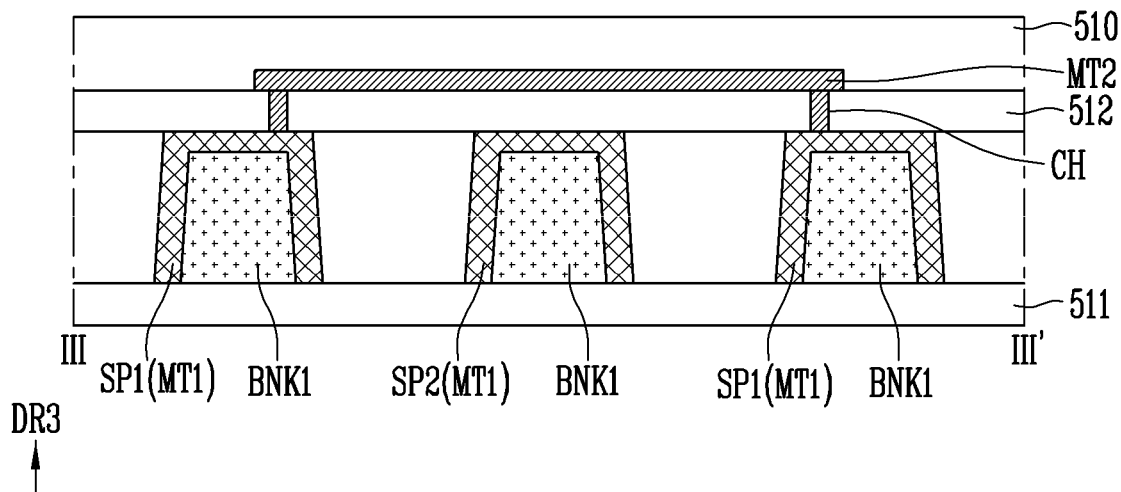

FIGS. 10 and 11 are cross-sectional views taken along the line III~III' of FIG. 6.

According to an embodiment, the second metal portion MT2 may be positioned under or on the first metal portion MT1 based on a base surface (e.g., the substrate SUB).

FIGS. 7 and 10 may be diagrams schematically illustrating the display device 1 having a structure in which the second metal portion MT2 is positioned under the first metal portion MT1.

Referring to FIGS. 7 and 10, the second metal portion MT2 may be disposed between the first metal portion MT1 and the display element portion DPL.

The second metal portion MT2 may connect (e.g., electrically connect) the first sensor patterns SP1 adjacent to each other, which are configured of or include the first metal portion MT1.

The first capping layer 511 may be disposed between the second metal portion MT2 and the first metal portion MT1. The first metal portion MT1 (e.g., a portion of the first metal portion MT1) may be disposed between the first bank BNK1 and the first capping layer 511. A contact hole CH may be formed in the first capping layer 511.

The second metal portion MT2 may connect (e.g., electrically connect) between the first metal portions MT1 corresponding to the adjacent first sensor pattern SP1. The second metal portion MT2 may be connected (e.g., electrically connected) to a portion of the plurality of first metal portions MT1 through the contact hole CH. At least a portion of the second metal portion MT2 may not be connected (e.g., electrically connected) to the first metal portion MT1 corresponding to the second sensor pattern SP2.

FIGS. 8, 9 and 11 may be diagrams schematically illustrating the display device 1 having a structure in which the second metal portion MT2 is positioned on the first metal portion MT1.

Referring to FIGS. 8, 9 and 11, the first metal portion MT1 may be disposed between the second metal portion MT2 and the display element portion DPL.

As described above, the second metal portion MT2 may connect (e.g., electrically connect) the first sensor patterns SP1 adjacent to each other among the sensor patterns SP1 and SP2 configured of or including the first metal portion MT1.

The second capping layer 512 may be disposed between the second metal portion MT2 and the first metal portion MT1. The first metal portion MT1 may be disposed between the first bank BNK1 and the second capping layer 512.

The second metal portion MT2 may connect (e.g., electrically connect) between the first metal portions MT1 corresponding to the adjacent first sensor pattern SP1. The second metal portion MT2 may be connected (e.g., electrically connected) to a portion of the plurality of first metal portions MT1 through the contact hole CH. In one or more embodiments, the contact hole CH may be positioned on the first metal portion MT1. The second metal portion MT2 may not be connected (e.g., electrically connected) to the first metal portion MT1 corresponding to the second sensor pattern SP2.

Meanwhile, as described above, the light emitting element LD applied to the display device 1 may be the organic light emitting diode, the inorganic light emitting diode, or the light emitting element LD configured of or including the organic and inorganic compounds.

According to an embodiment, when the light emitting element LD applied to the display device 1 is the inorganic light emitting diode, both of the display element portion DPL and the color conversion portion CCL may be arranged on the pixel circuit portion PCL.

FIG. 9 may illustrate a structure of the display device 1 according to an embodiment, when the light emitting element LD applied to the display device 1 is the inorganic light emitting diode.

The display element portion DPL according to an embodiment may include the light emitting element LD, a bank pattern BNP, a first electrode ELT1, a second electrode ELT2, a first contact electrode CNE1, and a second contact electrode CNE2.

Referring to FIG. 9, the display element portion DPL may be positioned on the pixel circuit portion PCL. At least a portion of the first bank BNK1 and the first metal portion MT1 included in the color conversion portion CCL may be positioned at the same height as the display element portion DPL. In one or more embodiments, each of the first bank BNK1, the first metal portion MT1, and the display element portion DPL may be between the pixel circuit portion PCL and the second capping layer 512 (along the third direction DR3).

The light emitting element LD may be positioned between the bank patterns BNP. The light emitting element LD may be an element including an inorganic material having a nano or micro scale, and may output light when an electrical signal is applied.

The light emitting element LD may include a first semiconductor layer, a second semiconductor layer, an active layer, and an insulating film. The first semiconductor layer may include a semiconductor layer having a set (e.g., predetermined) type (channel configuration), and the second semiconductor layer may include a semiconductor layer of a type (channel configuration) different from that of the first semiconductor layer. For example, the first semiconductor layer may include an N-type semiconductor layer, and the second semiconductor layer may include a P-type semiconductor layer.

The first semiconductor layer and the second semiconductor layer may include at least one semiconductor material selected from InAlGaN, GaN, AlGaN, InGaN, AlN, and InN.

The active layer may be positioned between the first semiconductor layer and the second semiconductor layer. The active layer may have a single or multiple quantum well structure.

When an electric field of a set (e.g., predetermined) voltage or more is applied to both ends of the light emitting element LD, electron-hole pairs may be combined in the active layer and light may be emitted.

The insulating film may cover at least a portion of an outer surface of the light emitting element LD. The insulating film may prevent or substantially prevent an electrical short and contamination that may occur due to contact between the active layer and materials (particularly other conductive materials) except for the first semiconductor layer and the second semiconductor layer.

The insulating film may include a transparent insulating material. According to an example, the insulating film may include at least one of silicon oxide ($SiOx$), silicon nitride ($SiNx$), silicon oxynitride ($SiOxNy$), aluminum oxide ($AlOx$), or titanium dioxide ($TiO2$).

The bank pattern BNP may have a shape protruding upward, and a reflective partition wall may be formed by an electrode configuration having a reflectivity and being arranged on the bank pattern BNP. Light efficiency of the light emitting element LD may be improved by the formation of the reflective partition wall.

The first electrode ELT1 and the second electrode ELT2 may be formed on the bank pattern BNP. The first electrode ELT1 and the second electrode ELT2 formed on the bank pattern BNP may guide light emitted from the light emitting element LD in a set (e.g., predetermined) direction, thereby increasing light emission efficiency of the light emitting element LD.

Each of the first contact electrode CNE1 and the second contact electrode CNE2 may contact (e.g., directly contact) at least a portion of the light emitting element LD. At least a portion of the light emitting element LD may not contact (e.g., directly contact) the first contact electrode CNE1 and the second contact electrode CNE2.

The first contact electrode CNE1 and the second contact electrode CNE2 may be connected (e.g., electrically connected) to the light emitting element LD. The first contact electrode CNE1 and the second contact electrode CNE2 may include at least one of conductive materials including indium tin oxide (ITO), indium zinc oxide (IZO), or indium tin zinc oxide (ITZO).

The second bank BNK2 may be positioned in the non-light emitting area NLA. The second bank BNK2 may be a structure defining the light emitting area LA of the pixel PXL. For example, the second bank BNK2 may be disposed in a boundary area between adjacent pixels PXL to surround the light emitting area LA of the pixel PXL.

The area where the second bank BNK2 is positioned may overlap an area where the first bank BNK1 is positioned in a plan view. Similar to the first bank BNK1, the second bank BNK2 may overlap a position of the second metal portion MT2 in a plan view.

According to an embodiment, the light emitted from the light emitting element LD included in the display device 1 may move along a set (e.g., predetermined) recycling path, and thus the display device 1 with improved light efficiency may be provided.

Figure 12:
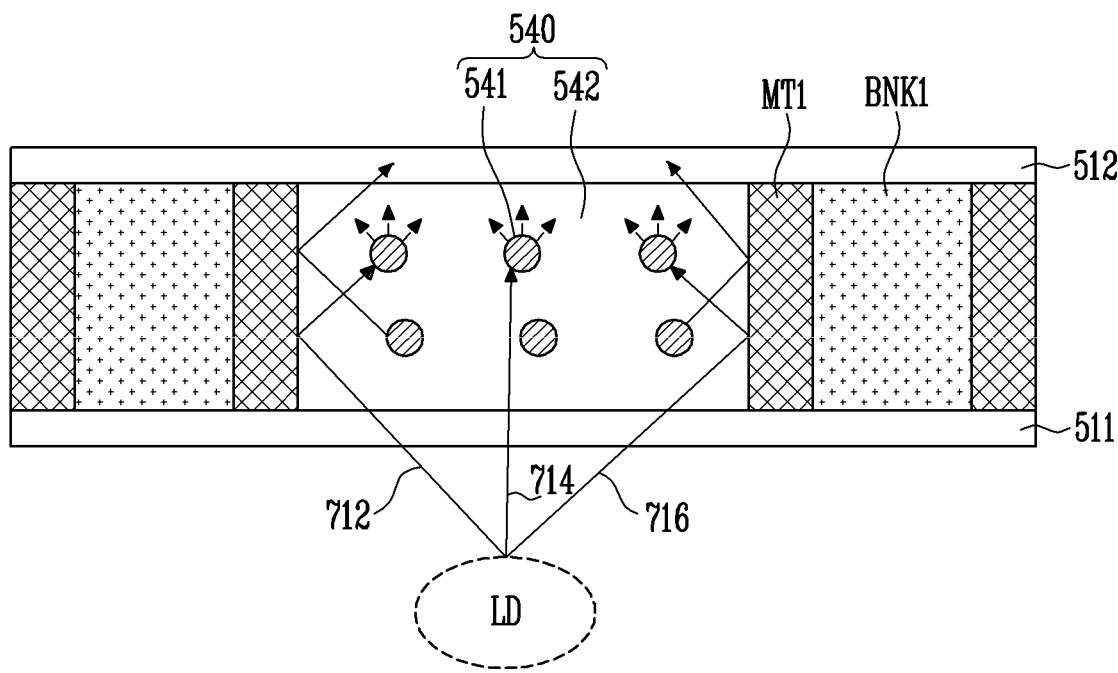
FIG. 12 is a diagram illustrating a light recycling mechanism for light emitted from the display device according to an embodiment.

FIG. 12 is a diagram illustrating a light recycling mechanism for light emitted from the display device according to an embodiment.

As described above, the light output from the light emitting element LD may transmit the color conversion portion CCL and may be provided to the outside.

Hereinafter, for convenience of description, description is given based on the light passing through the second wavelength conversion pattern 540 of the color conversion portion CCL, and description of other configurations including the first wavelength conversion pattern 530 and the light transmission pattern 550 may not be repeated to prevent repetitive description.

Referring to FIG. 12, the light output from the light emitting element LD may pass through the second wavelength conversion pattern 540 and may be emitted to the outside.

The light emitted from the light emitting element LD may transmit the second wavelength conversion pattern 540 along a first path 712, a second path 714, and a third path 716.

The light provided along the first path 712 may reach the first metal portion MT1 positioned on one side of the second wavelength conversion pattern 540. The light provided along the second path 714 may reach the second wavelength conversion material 541 without reaching the first metal portion MT1. The light provided along the third path 716 may reach the first metal portion MT1 positioned on another side of the second wavelength conversion pattern 540.

The light provided to the first metal portion MT1 along the first path 712 and the third path 716 may be provided to at least a portion of the second wavelength conversion pattern 540 again by reflective properties of the first metal portion MT1. As a result, the first metal portion MT1 formed to face the second wavelength conversion pattern 540 on the first bank BNK1 may allow the light provided from the light emitting element LD to be emitted to at least one region of the second wavelength conversion pattern 540 or the outside, and thus the light emission efficiency of the display device 1 may be improved.

As described above, the first metal portion MT1 may function as the sensor electrode of the display device 1. That is, the first metal portion MT1 may function as the sensor electrode, and may also perform a reflector function for the light applied from the light emitting element LD in parallel. Therefore, the number of configurations or parts needed for the display device 1 may be reduced, and as a result, a process or manufacturing cost may be reduced.

According to an embodiment, even though the first bank BNK1 included in the display device 1 does not include a light blocking material and/or a reflective material, the light efficiency may be improved by the first metal portion MT1 arranged on the first bank BNK1.

The first bank BNK1 may include the organic material or the inorganic material as described above, and the light blocking properties and/or the reflectivity of the material applied to the first bank BNK1 is not limited to a specific material having high or low light blocking properties and/or reflectivity as described above.

However, according to related art, the first bank BNK1 may define the non-light emitting area NLA, and thus light may not be transmitted to the area where the first bank BNK1 is positioned. That is, in order to improve the light efficiency of the display device 1, the first bank BNK1 may be formed of a light blocking and/or reflective material.

In one or more embodiments, when the first bank BNK1 is configured of or includes the light blocking and/or reflective material, formation of the first bank BNK1 may be difficult. Specifically, when the first bank BNK1 is configured of or includes the light blocking and/or reflective material, during an exposure process to form the first bank BNK1, light may not sufficiently penetrate a lower region of the first bank BNK1. Therefore, while a developing process for the first bank BNK1 is performed, an undercut phenomenon in which a portion of the lower region is removed may occur. Furthermore, the first bank BNK1 in which the undercut phenomenon occurs may not be fixed at a set (e.g., predetermined) position while a cleaning process is performed. The above-described problem is intended to be improved through a reflow process. However, according to the reflow process, a new problem that a wavelength conversion material (e.g., a quantum dot as the second wavelength conversion material 541) provided between the first banks BNK1 is not sufficiently positioned may occur.

However, according to an embodiment of the present disclosure, the first bank BNK1 may not be configured of or include a light blocking and/or reflective material. When the first bank BNK1 includes a material having low light blocking properties and/or reflectivity, light may sufficiently reach a lower portion of the first bank BNK1 during the exposure process of the first bank BNK1 described above, and as a result, an undercut phenomenon may not occur in the first bank BNK1.

Finally, according to an embodiment, as the problem occurring while the process for the first bank BNK1 is performed is addressed, the light efficiency may be improved by the first metal portion MT1 formed on the first bank BNK1. Furthermore, the first metal portion MT1 may additionally perform a function as the sensor electrode. Thus, process steps (acts) may be reduced and an additional process cost may be reduced.

The above description is merely an example of the technical spirit of the present disclosure, and those skilled in the art to which the present disclosure pertains will be able to make various modifications and variations without departing from the essential characteristics of the present disclosure. Therefore, the embodiments of the present disclosure described above may be implemented separately or in combination with each other.

While the present disclosure has been particularly shown and described with reference to some example embodiments thereof, it will be understood by those of ordinary skill in the art that various changes in form and details may be made therein without departing from the spirit and scope of the present disclosure as set forth in the following claims and their equivalents.

What is claimed is:

1. A display device comprising:
    a substrate;
    a display element portion on a surface of the substrate, the display element portion comprising a plurality of display pixels;
    a color conversion portion on the display element portion, the color conversion portion comprising a plurality of banks and a wavelength conversion pattern between the plurality of banks; and
    a sensor electrode configured to obtain information of a touch input,
    wherein the sensor electrode comprises a first conductive layer arranged directly on at least a part of a surface of the plurality of banks.

2. The display device according to claim 1, wherein the sensor electrode further comprises a plurality of first sensor patterns forming a first line along a first direction, and a plurality of second sensor patterns forming a second line along a second direction different from the first direction.

3. The display device according to claim 2, wherein a first one of the plurality of first sensor patterns is at least a portion of the first conductive layer, and a first one of the plurality of second sensor patterns is another portion of the first conductive layer.

4. The display device according to claim 2, wherein at least a portion of the first conductive layer electrically connects adjacent ones of the plurality of first sensor patterns to each other.

5. The display device according to claim 2, further comprising:
    a second conductive layer different from the first conductive layer.

6. The display device according to claim 5, further comprising:
    a capping layer between the first conductive layer and the second conductive layer.

7. The display device according to claim 6, wherein the first conductive layer and the second conductive layer are electrically connected to each other through a contact hole in the capping layer.

8. The display device according to claim 5, wherein the second conductive layer is between the first conductive layer and the display element portion.

9. The display device according to claim 5, wherein the second conductive layer overlaps at least one of the plurality of banks in a plan view.

10. The display device according to claim 5, wherein the first conductive layer and the second conductive layer comprise a metal.

11. The display device according to claim 5, wherein at least a portion of the second conductive layer electrically connects adjacent ones of the plurality of second sensor patterns to each other.

12. The display device according to claim 5, wherein the first conductive layer and the second conductive layer overlap each other in a plan view.

13. The display device according to claim 1, wherein the first conductive layer overlaps at least one of the plurality of banks in a plan view.

14. The display device according to claim 1, wherein the first conductive layer comprised in the sensor electrode is arranged in a mesh pattern.

15. The display device according to claim 1, wherein the display device comprises a light emitting area and a non-light emitting area, the light emitting area and the non-light emitting area are separated from each other by at least one of the plurality of banks, and the first conductive layer is in the non-light emitting area.

16. The display device according to claim 1, wherein at least a portion of the first conductive layer is on a side surface of the plurality of banks.

17. The display device according to claim 1, wherein the wavelength conversion pattern comprises at least one of a quantum dot, a quantum rod, or a phosphor.

18. The display device according to claim 1, further comprising:
    a filling layer between the first conductive layer and the display element portion.

19. The display device according to claim 1, further comprising:
    a color filter portion comprising a color filter to selectively transmit light having a specific wavelength.

20. The display device according to claim 1, wherein a display pixel of the plurality of display pixels is at least one of an organic light emitting diode, an inorganic light emitting diode, or a diode, the display pixel comprising organic and inorganic compounds.

21. The display device according to claim 1, wherein the first conductive layer contacts the surface of the plurality of banks.

22. The display device according to claim 1, wherein the first conductive layer is on the plurality of banks such that a surface of the first conductive layer corresponds to the surface of the plurality of the banks.

* * * * *